United States Patent [19]

Oae et al.

[11] Patent Number: 5,041,731
[45] Date of Patent: Aug. 20, 1991

[54] DEFLECTION COMPENSATING DEVICE FOR CONVERGING LENS

[75] Inventors: Yoshihisa Oae; Akio Yamada, both of Kawasaki, Japan

[73] Assignee: Fujitsu Limited, Kawasaki, Japan

[21] Appl. No.: 472,984

[22] Filed: Jan. 12, 1990

[30] Foreign Application Priority Data

Jan. 20, 1989 [JP] Japan .................................. 1-9778
Mar. 20, 1989 [JP] Japan ................................. 1-68326

[51] Int. Cl.⁵ .................... H01J 37/141; H01J 37/12; H01J 37/145
[52] U.S. Cl. .......................... 250/396 ML; 250/396 R
[58] Field of Search ........... 250/396 R, 396 ML, 398; 313/361.1

[56] References Cited

U.S. PATENT DOCUMENTS

| | | | |
|---|---|---|---|
| 3,197,635 | 7/1965 | Van Dorsten et al. | 250/396 R |
| 4,218,621 | 8/1980 | Nakasuji et al. | 250/396 R |
| 4,525,629 | 6/1985 | Morita et al. | 250/396 ML |
| 4,546,258 | 10/1985 | Chisholm | 250/396 R |
| 4,710,639 | 12/1987 | Sawaragi et al. | 250/398 |
| 4,785,176 | 11/1988 | Frosien et al. | 250/396 R |
| 4,859,856 | 8/1989 | Groves et al. | 250/396 ML |

*Primary Examiner*—Bruce C Anderson
*Attorney, Agent, or Firm*—Armstrong, Nikaido, Marmelstein, Kubovcik & Murray

[57] ABSTRACT

A deflection compensating device for a converging lens includes a first electrostatic deflector by which a charged particle beam is deflected to a desired position by applying an electrical field to the charged particle beam. An electromagnetic type converging lens is where the charged particle beam is converged by applying a magnetic field to a beam deflected by the first electrostatic deflector. A second electrostatic is disposed in a magnetic field generated by the converging lens and generates an electrical field in a direction deviated by 90° with respect to the direction of the electrical field generated by the first electrostatic deflector. The passage way of the charged particle beam which passes through the electromagnetic type converging lens substantially corresponds to the lens center axis of the electromagnetic type lens.

5 Claims, 12 Drawing Sheets

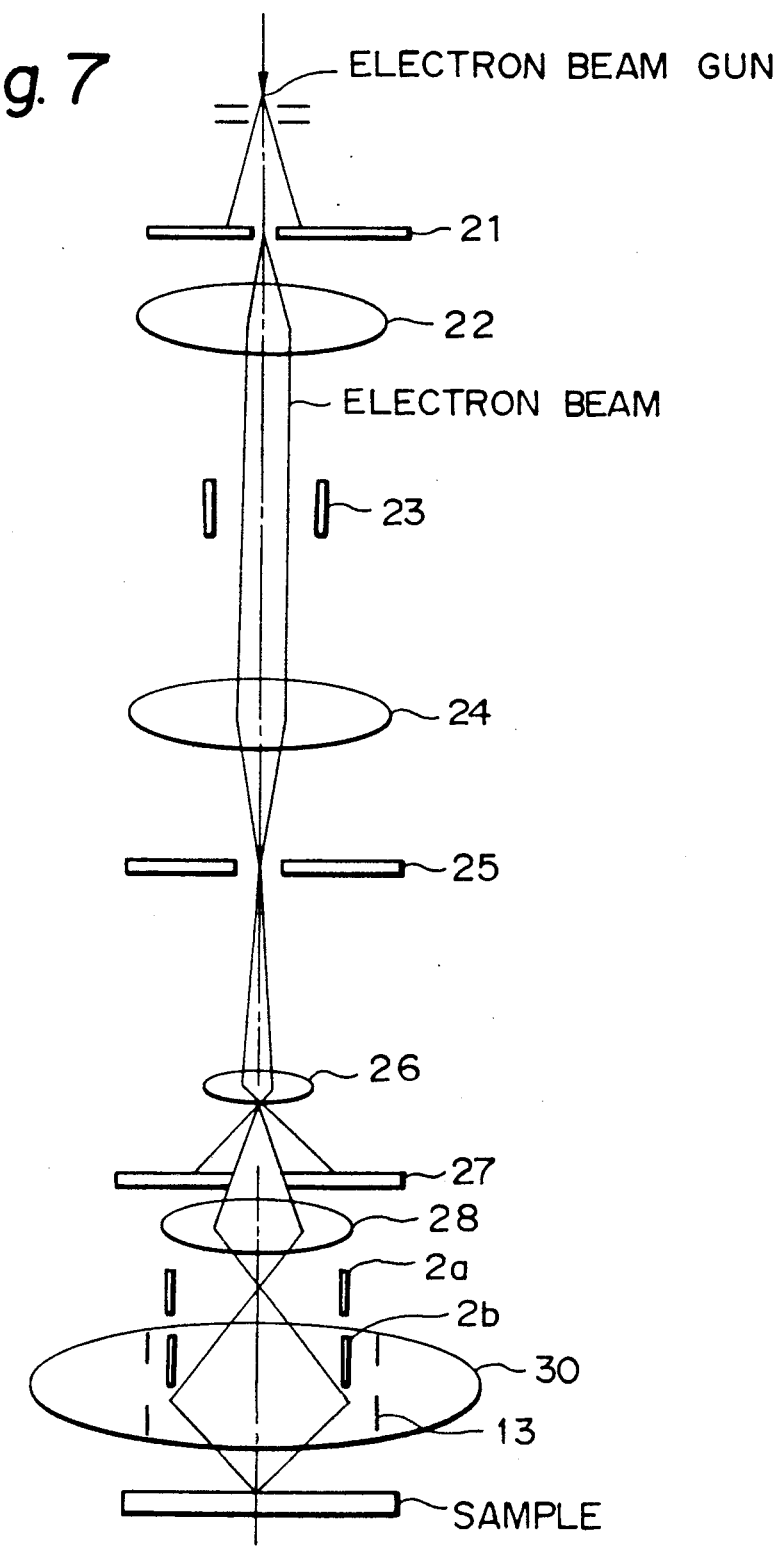

→ TRANSVERCIBLY DIRECTED MAGNETIC FIELD
⇒ FORCE
⊗ BEAM CENTER

DEFLECTION COMPENSATING DEVICE FOR CONVERGING LENS

BACKGROUND OF THE INVENTION

1. Field of the Invention

The present invention relates to a deflection compensating device for a converging lens and more particularly, to a charged particle beam exposing device and an electrostatic deflecting apparatus.

2. Description of the Related Art

Deflection is a basic technique used in a charged particle beam method. Namely, in an exposure method using an electron beam, a low aberration high speed deflection is required, and accordingly, the deflectors are separated into those giving a large deflection and those giving a small deflection. An electromagnetic type deflector is used for the large deflection, and an electrostatic multi-electrode cylindrical type deflector operated at a high scanning speed and a low voltage is used for the small deflection. As a deflecting system by which a deflection aberration due to a magnetic field is lessened, a Moving Objective Lens (MOL) system is well known. In the MOL system, for the large deflection a lens center is moved by a transversely directed magnetic field so that a deflected beam passes through a center of a magnetic field type conversing lens. Similarly, in the electrical field type deflector for a small deflection, to keep the deflection aberrations at a low level, the lens center can be moved in accordance with an amount of deflection, to reduce the aberration. Note, since the electrical field type deflection speed is higher than the magnetic field type deflection speed, the movement of the lens center in accordance with the electrical field type deflection speed cannot be obtained by a transversely directed magnetic field.

Further, each electrical field type deflector has a high degree of accuracy of divided angles for electrodes and of the assembly. Nevertheless, when the electrical field type deflectors are formed with a structure having a plurality of stages, a high concentricity of each deflector with respect to the lens axis, mutual concentricities between deflectors, and a high degree of accuracy of relative angles and positions is not easily obtained, due to the method of fixing to a column at which the deflectors are supported.

Further, as shown in FIG. 1, a converging lens 8 and a last converging lens 9 are provided around a vacuum wall 10, and since an electrical field type deflector 11 for a small deflection is provided near the last converging lens 9, it should be provided inside a coil which is a magnetic field type deflector 13 for a large deflection. Further, a hermetic seal 12 and a vacuum flange 14 should be provided inside the coil 13. Therefore, the provision of a plurality of electrical field type deflectors 11 near the last converging lens 9 increases the size of the last lens stage structure of the column, with the result that the deflection aberration becomes larger.

Therefore, when a plurality of electrical type deflectors are assembled as a structure having a plurality of stages, the last lens must have a long length, with the result that a low deflection aberration can not be realized. Even if the positioning of above mentioned structure can be carried out, if the assembly is once decomposed this complex and difficult positioning must be again carried out.

SUMMARY OF THE INVENTION

An object of the present invention is to provide a deflection compensating device for a converging lens comprising:

a first electrostatic deflector by which a charged particle beam is deflected to a desired position by applying an electrical field to the charged particle beam;

an electromagnetic type converging lens by which the charged particle beam is converged by applying a beam deflected by the first electrostatic deflector;

a second electrostatic deflector disposed in a magnetic field generated by the converging lens and generating an electrical field in a direction deviated by 90° with respect to the direction of the electrical field generated by the first electrostatic deflector, the passage way of the charged particle beam which passes through the electromagnetic type converging lens substantially corresponding to the lens center axis of the electromagnetic type lens. According to the prevent invention, an electron beam or an ion beam is preferably used as the charged particle beam. Another object of the present invention is to provide a charged particle beam exposing device wherein a charged particle beam passed through a mask is irradiated to a sample to be exposed through the deflection compensating device for a converging lens.

Further, according to the present invention, there is provided an electrostatic deflecting apparatus, wherein the first and second deflectors respectively comprise a plurality of electrode plates concentrically and cylindrically disposed, a direction of a first electrical field generated by the first electrostatic deflector being deviated by 90° with reference to a director of a second electrical field generated by the second electrostatic deflector and the first electrostatic deflector and the second electostatic deflector respectively being fixed together to the same insulating cylindrical element.

According to the present invention, the relative angle and the relative position of deflectors in the last magnetic field converging lens can be concentrically defined. Further, by uniting a plurality of deflectors, preferably two-deflectors, with a good fit, a separate arrangement of the deflectors is not needed. Accordingly, once the setting of the relative position and the related angle of the united defectors is carried out, a resetting thereof is not needed as long as the united deflectors are not decomposed.

Therefore, when a column is decomposed due to a charge up, etc., the position setting of the electrostatic deflecting system can be realized merely by an alignment of the ray axis of the charged particle beam and the axis of the deflecting system.

Further, since both the electrostatic deflectors and the magnetic field type deflectors are assembled in the last converging lens, the length of the column is shortened.

In the present invention, a cylindrical multi-electrode deflector is supported at one end of a cylindrical supporting element, and at the other end thereof, concave and convex portions by which a relative position, relative angle and concentricity are defined, are provided. Thus, by uniting one cylindrical supporting element with a deflector with another cylindrical supporting element with another deflector, with a good fit, the deflectors can be arranged concentrically and cylindrically.

In the present invention the deflector preferably consists of four, eight, or twenty electrodes.

BRIEF DESCRIPTION OF THE DRAWINGS

FIG. 7 is a schematic view of an exposing device according to the present invention;

DESCRIPTION OF THE PREFERRED EMBODIMENTS

In the present invention, a center axis of a converging lens is compensated by using electrostatic deflectors.

Figure 2:
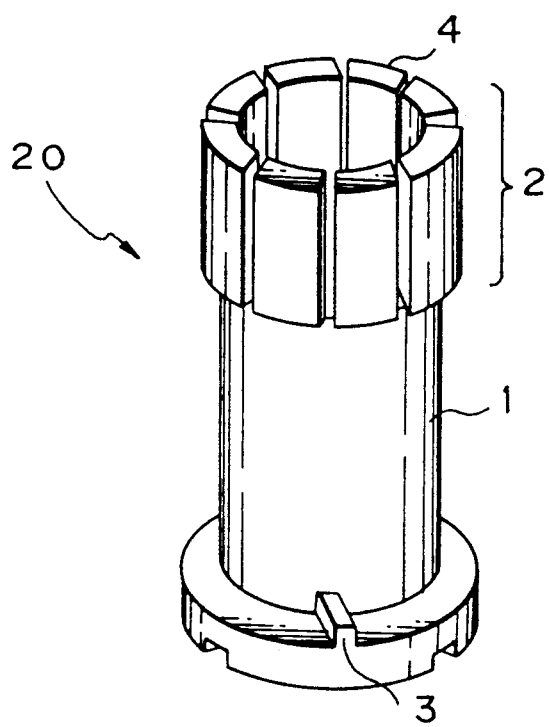
FIG. 2 is a perspective view of an electrostatic deflector before being united with another electrostatic deflector, according to the present invention.

FIG. 2 shows a perspective view of an electrostatic deflecting apparatus 20 before united with another electrostatic deflecting apparatus.

In FIG. 2 deflectors 2 consisting of 8 cylindrical electrodes 4 are supported by a ceramic cylindrical supporting element 1 concentric to the electrodes 4.

The length of the supporting element 1 defines the positions of one electrostatic deflector, and the relative degree of angle in a combination of a plurality of deflectors 2 can be determined by an angle defining concave and convex portions 3 provided at an end portion of the supporting element 1.

Figure 3A:
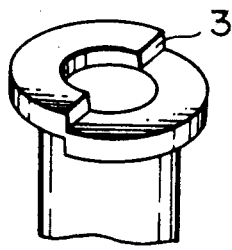
FIGS. 3A to 3C are examples of united structures.
Figure 3B:
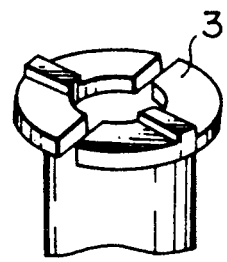
Figure 3C:
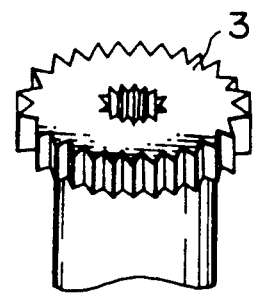

The combination angle of the deflecting apparatus 20 can be defined by using concave and convex portions 3 shown in FIGS. 3A, 3B, and 3C.

Figure 4:
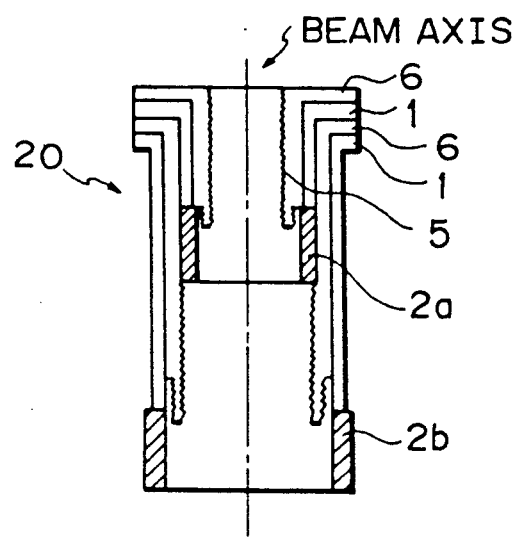
FIG. 4 is a cross-sectional view of a deflecting apparatus wherein two-stage deflectors are united with a good fit, according to the present invention.

FIG. 4 is cross-sectional view of a deflecting apparatus wherein two-stage deflectors are united with a good fit, according to the present invention.

Namely, the united deflecting apparatus comprises two sets of deflectors, i.e., an upper deflector 2a and a lower deflector 2b. Each deflector is assembled to a cylindrical supporting element 1 and a concentric cylindrical element is fixed inside the supporting element 1.

The inner surface of the concentric cylindrical element 6 made of insulating material is metal plated, to prevent the charge-up generated inside of the supporting element 1. The provision of the metal plated for example, gold plated, surface at the inner surface of the cylindrical element 6 ensures that the electron beam does not come directly into contact with the insulating element 6, and thus that the above-mentioned charge-up does not occur.

Figure 5A:
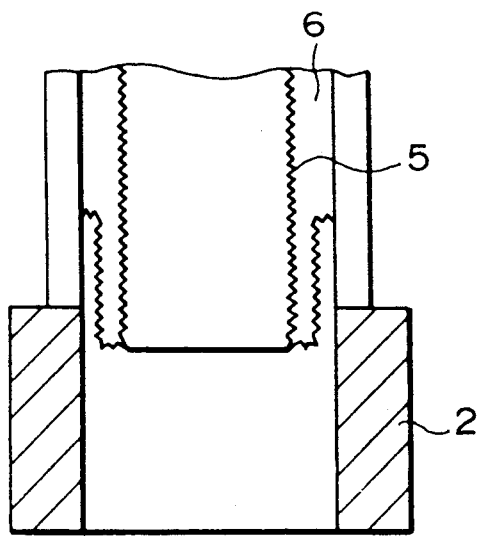
FIGS. 5A and 5B are schematic cross sectional explanatory views of metal plating.
Figure 5B:
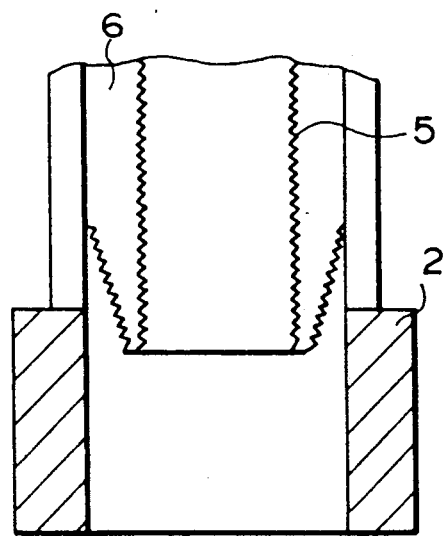

A metal plated portion near the electrode 2 may be mechanically worked, as shown in FIG. 5A, to insulate the electrode 2. The metal plated insulating element 6 is overlapped with an edge of the electrode. A lower end of the insulating cylindrical element 6 may be slantingly worked as shown in FIG. 5B.

Figure 6:
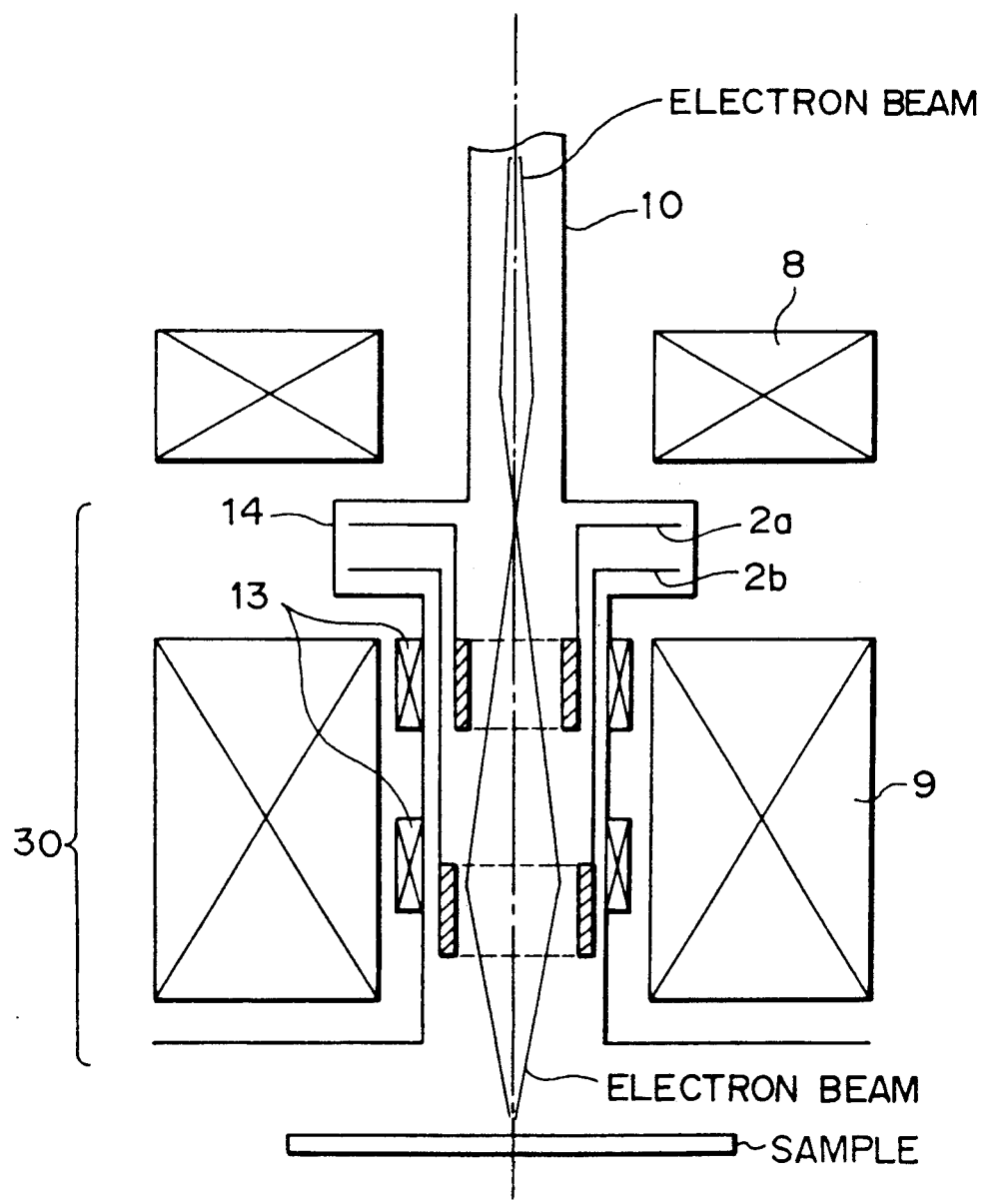
FIG. 6 is a schematic view of an example of a deflecting apparatus in which two-step concentric cylindrical type multi-electrode electrostatic deflectors are assembled.

FIG. 6 is a schematic view of an example of a deflecting device in which two-stage concentric cylindrical type electrostatic multi-electrode deflectors are assembled.

Figure 1:
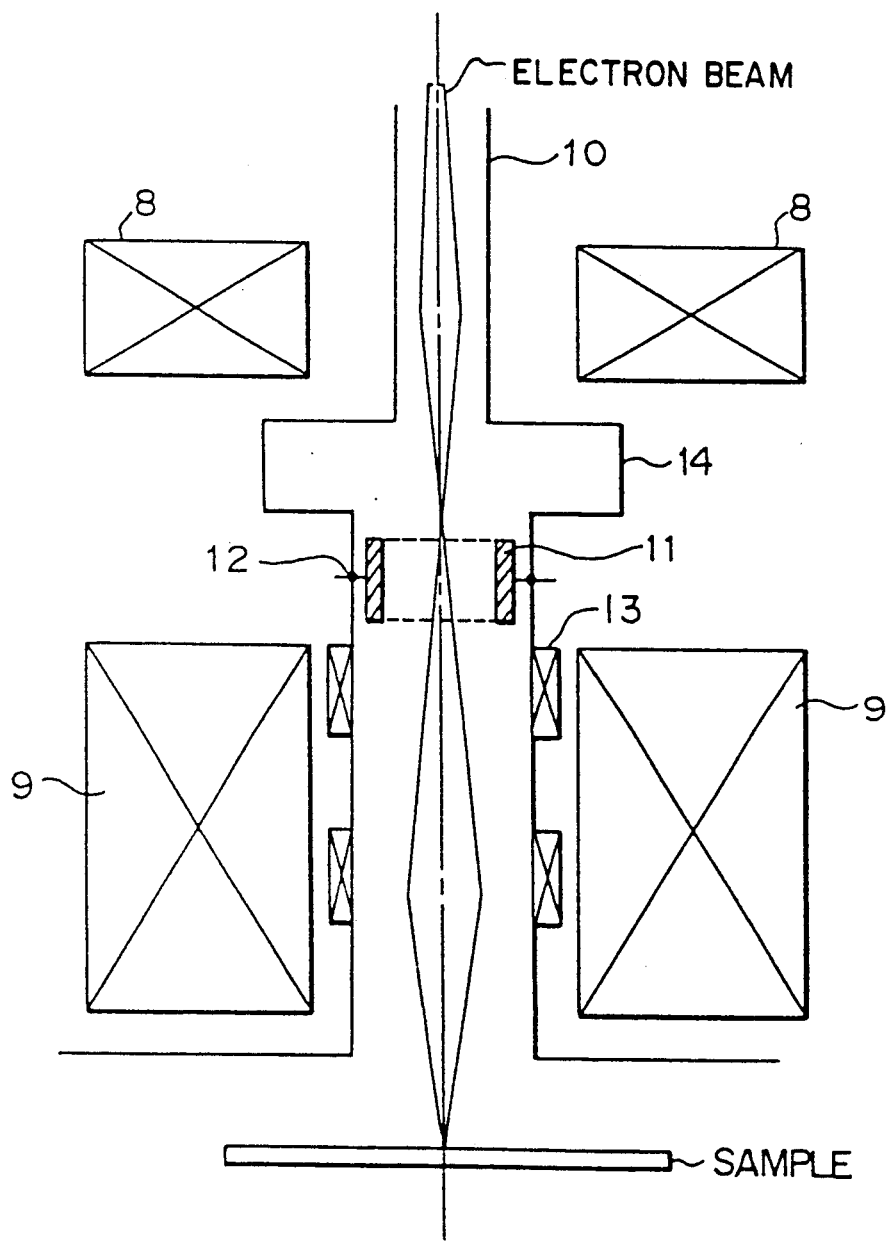
FIG. 1 is a schematic explanatory view of a conventional method of electron beam exposure.

The two step-electrostatic deflectors are secondary deflectors surrounded by main electromagnetic deflectors 13. The deflecting apparatus shown in FIG. 6 has a last lens section 30 consisting of a last lens 9, the electromagnetic deflectors 13 and a two-stage concentric cylindrical multi-electrode electrostatic deflector (2a, 2b). The last lens section 30 of the example shown in FIG. 6 is shorter than that of a conventional deflector shown in FIG. 1, which is one feature of the present invention.

The use of a hermetic seal 12 makes it physically impossible to arrange an electrostatic deflector 13 at a region where electromagnetic deflectors are provided. Thus in a conventional deflecting apparatus, shown in FIG. 1. the electrostatic deflector 13 must be provided so that the position of the deflector II is deviated from the position of the electromagnetic deflectors 13. Nevertheless, as explained above, the structure of the present deflecting apparatus shown in FIG. 6 has no such problem, even if the secondary electrostatic deflectors are formed by two combined sections, and thus a short length last lens 9 can be produced.

Further, the differences between the conventional MOL system and the present invention reside in that in the MOL system, the electron beam can be moved by applying another magnetic field thereto in a magnetic field. In the present invention, however, the electron beam can be moved by applying an electrical field thereto in a magnetic field. FIG. 7 shows a schematic view of an exposing device according to the present invention.

The exposing device shown in FIG. 7 comprises a first aperture 21 of a first lens 22, a deflector 23, a second lens 24, a second aperture 25, a third lens 26, a round aperture 27, a fourth lens 28, a last lens 30, an electromagnetic type deflector 13, and an electrical field type deflector (2a, 2b). In this exposing device, the electrical type deflector used is the deflector of the present invention. An electron beam emitted from electron beam gun is converged by the exposing device on a surface of a sample, with a very small deflection aberration.

Figure 8A:
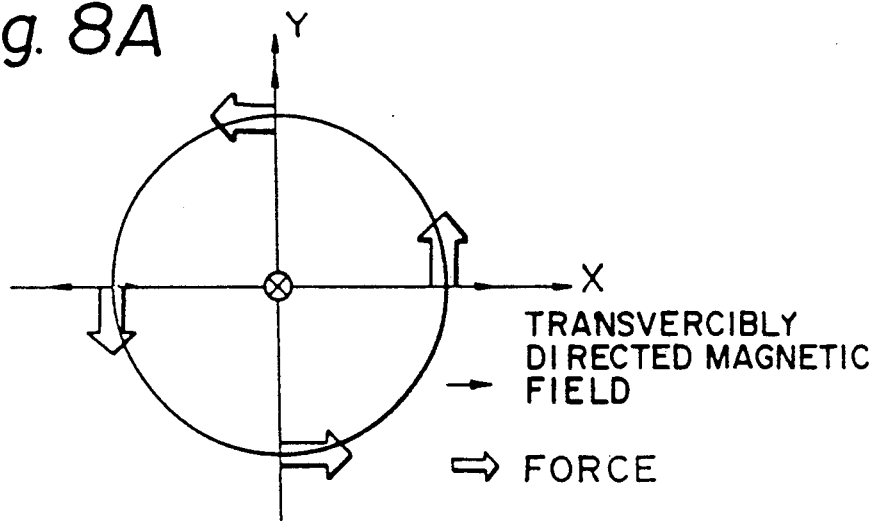
FIGS. 8A to 8C are schematic explanatory views of a method of forming a state similar to that wherein a lens center is moved, by using a plurality of stages of electrical field type deflectors.
Figure 8B:
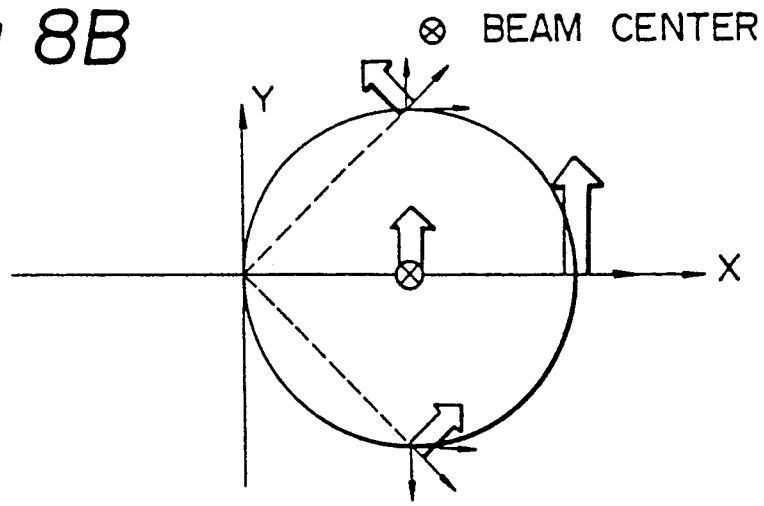
Figure 8C:
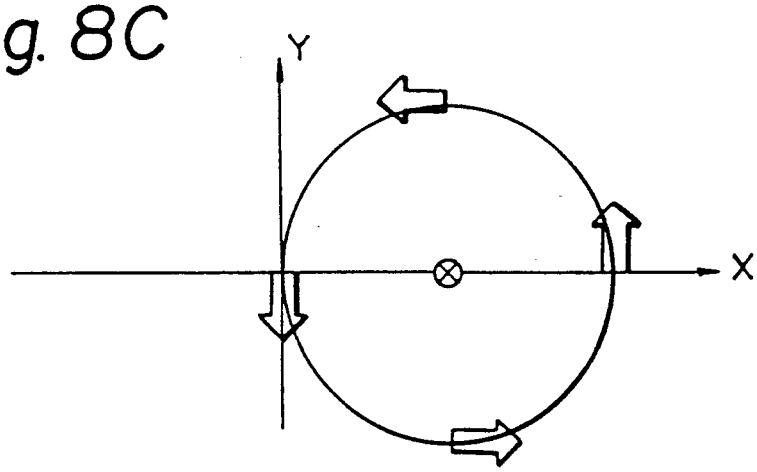

FIGS. 8A to 8C are schematic views explaining a method of forming a state similar to that wherein a lens center is moved by using a plurality of stages of an electrical field type deflector. FIG. 8A shows a transversely directed component of a lens magnetic field where an electron beam was emitted into a converging lens center and a force received by a round section beam at four points on the x and y axises and at a beam center.

FIG. 8B shows a case where beam entered at a position deviated from a converging lens by the radius of the beam.

In the case of FIG. 8A, the beam receives a converging force while rotating a beam center acting as an axis. In a case of FIG. 8B, however the beam receives a force spinally rotating around an original beam center axis, whereby a deflection aberration becomes large. Thus, an electrical field is applied to the force so that the force received by the beam center becomes zero. The forces received by the beam from an electrical field have the same size and the direction at all positions. The resultant force is shown in FIG. 8C as can be seen from FIG. 8C, a force received by the beam is the same as that of FIG. 8A, whereby the same state exists as that in which the beam has actually entered a lens center, i.e., a state wherein a lens center of FIG. 8A is deviated, can be formed so that the deflection aberration becomes small.

Namely, a second stage deflector is provided in such a manner that it is rotated by 90 degrees with respect to a first stage deflector, so that a beam deflected by a first stage deflector does not begin to rotate the original beam center by a converging lens magnetic field.

Figure 9:
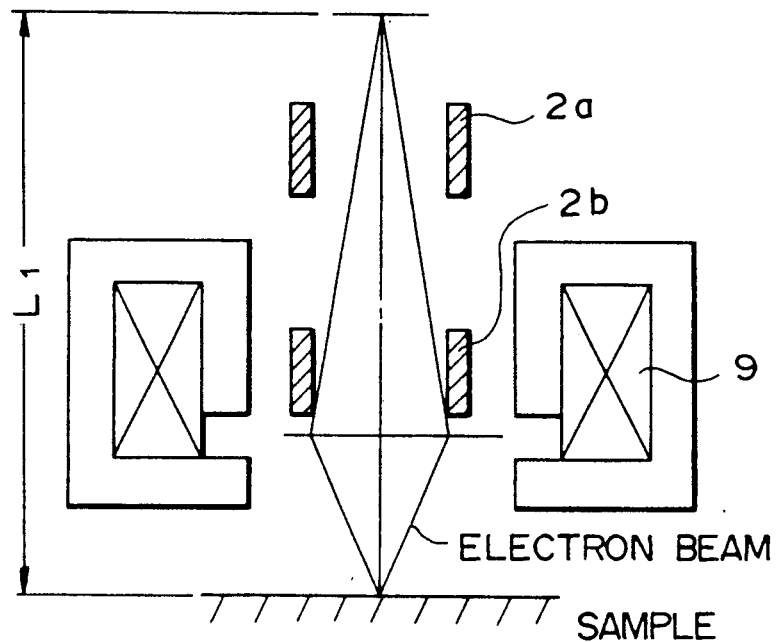
FIG. 9 is a schematic view of the positions and voltages of upper and lower electrodes

In an eight electrostatic electrode deflector, as shown in FIG. 9, when a relative angle is 90°, the positions of the electrical field direction of the electrode deflectors correspond. Namely, the two stage electrode deflector may be deviated by 90° from the first stage electrode deflector.

Figure 10:
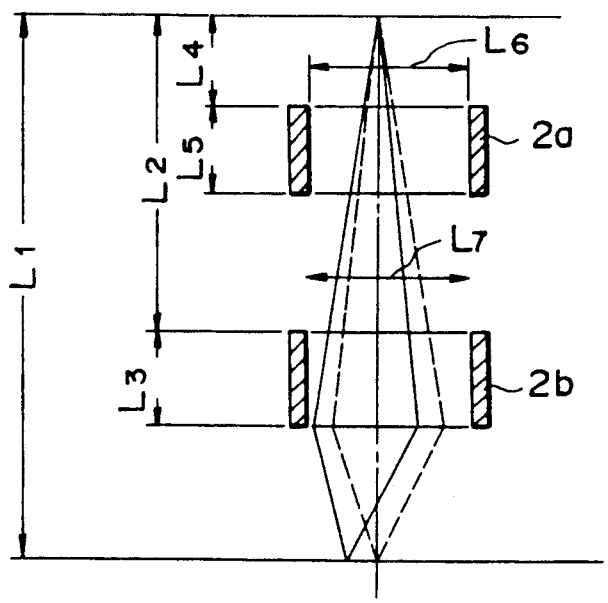
FIG. 10 is a schematic cross-sectional view of a coil for a lens acting as a last lens, and a first and second stage electrostatic deflector according to the present invention; and, FIGS. 11A and 11B are schematic cross-sectional views of a positional relationship between an optical system and a first and a second stage electrostatic deflector, according to the present invention.
Figure 11A:
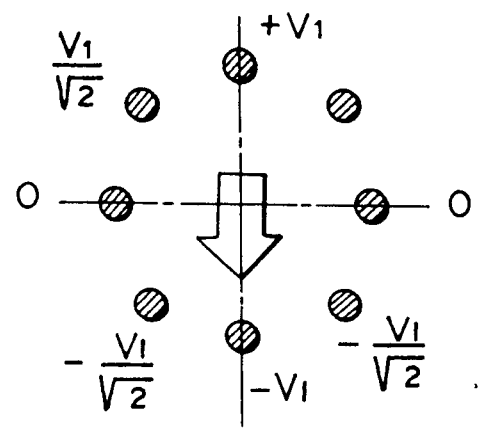
Figure 11B:
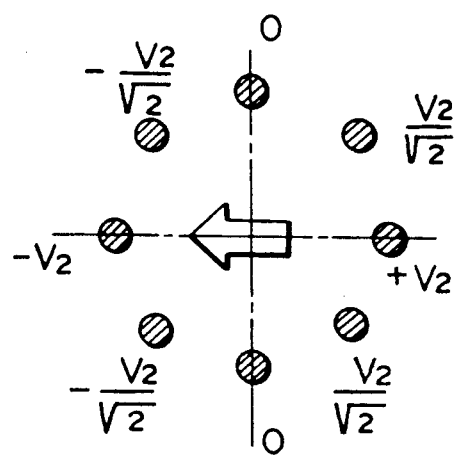

FIGS. 10 shows a schematic cross-sectional view of a coil for a lens acting as a last lens, and a first and second stage electrostatic deflector according to the present invention, and FIG. 11A-11B show a schematic cross-sectional view of a positional relationship between an optical system and first and a second stage electrostatic deflectors according to the present invention.

In FIGS. 10 and 9, L1, L2, L3, L4, L5, L6, and L7 are respectively 180 mm, 90 mm, 20 mm, 50 mm, 20 mm, 20 mm, and 20 mm. The lens coil 9 is excited by 1800 AT (ampere turn).

The distances between electrodes of the first and the second stage deflectors 2a and 2b are defined as 20 mm. The voltage of the first stage (upper stage) deflector is applied as ±1 V, respectively, and the voltage of the second stage (lower stage) deflector is applied as ±6 V, respectively.

Figure 12:
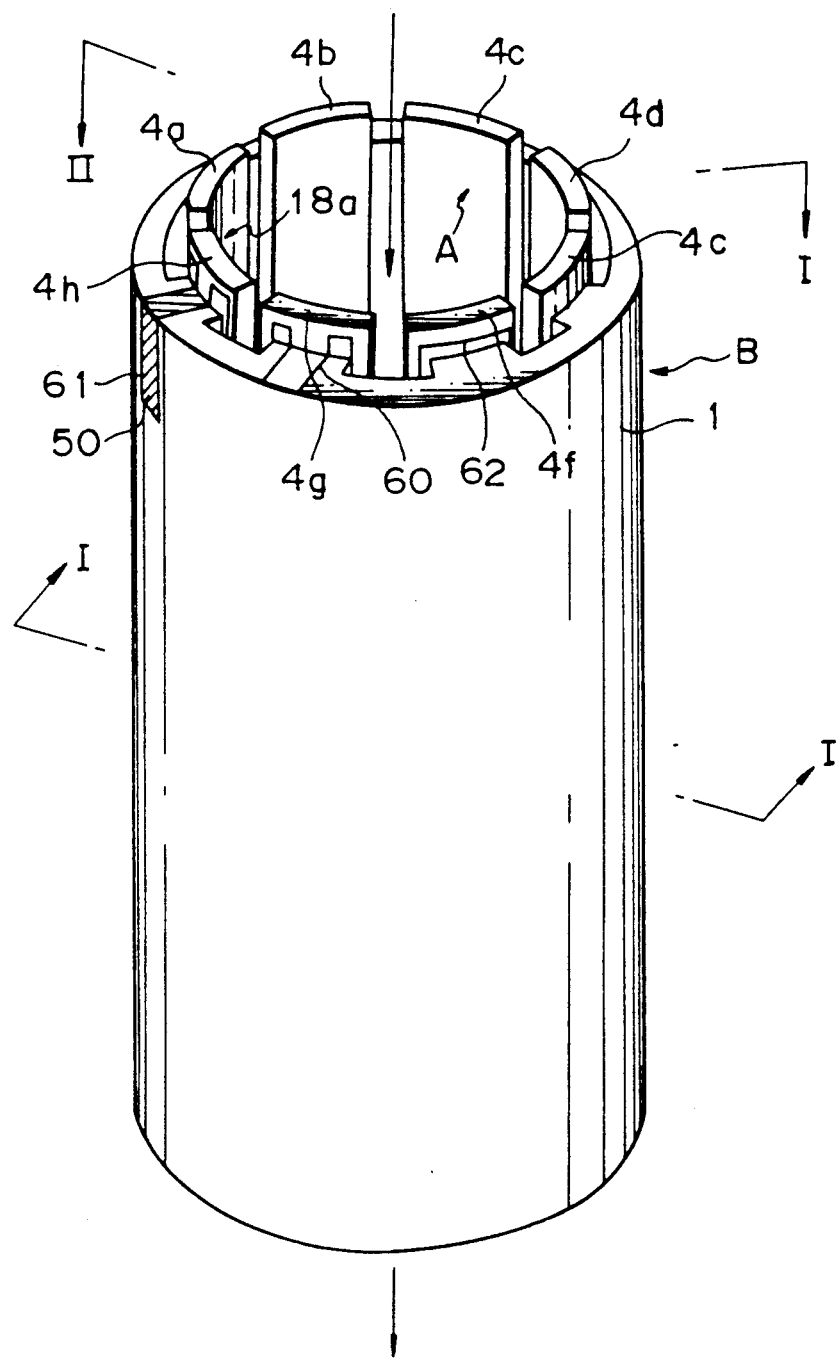
FIG. 12 is a perspective view of an electrostatic deflecting apparatus according to the present invention.
Figure 13:
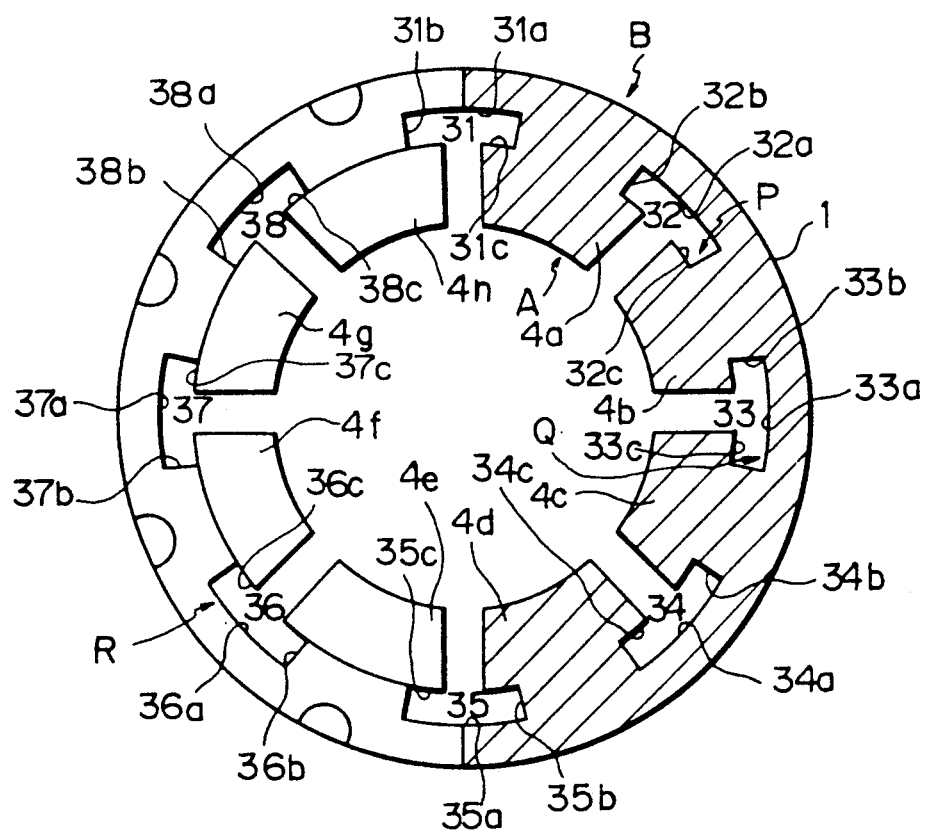
FIG. 13 is a cross-sectional view taken along a line I—I of FIG. 12.
Figure 14:
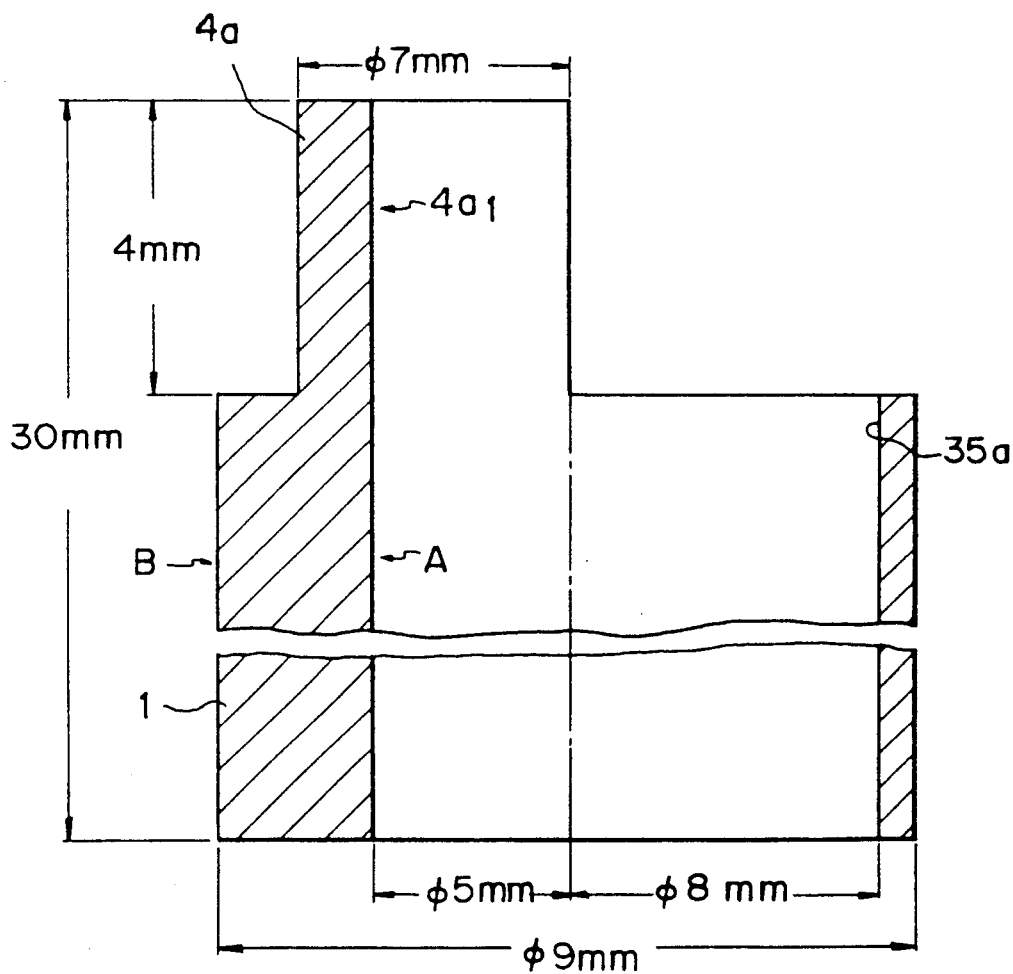
FIG. 14 is a cross-sectional view taken along a line II—II of FIG. 12.
Figures 15A, 15B, 15C:
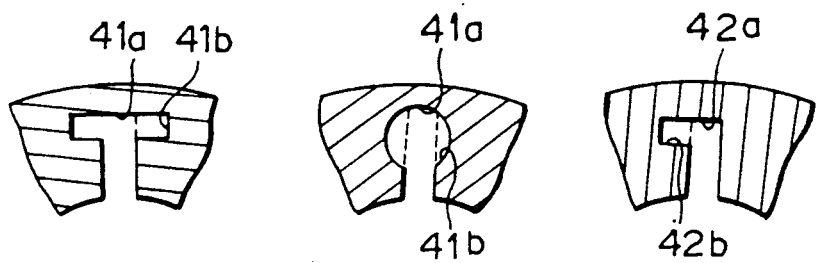
FIG. 15A to FIG. 15G are cross-sectional view of other examples of grooves.
Figures 15D, 15E, 15F:
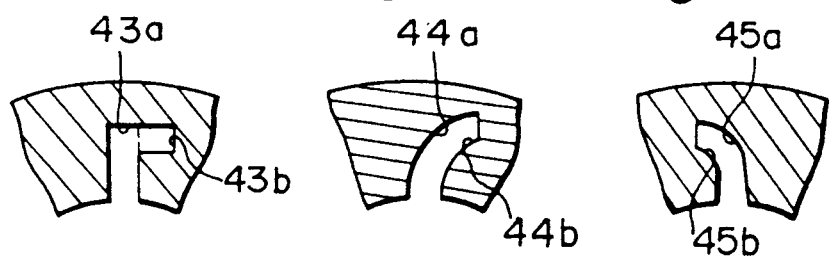
Figures 15G, 16A, 16B:
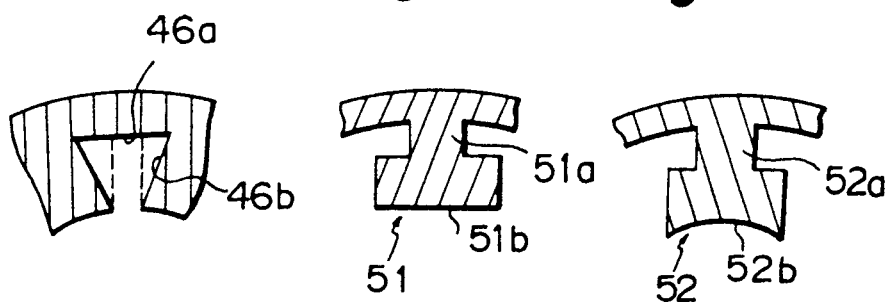
FIG. 16A to 16D are cross-sectional views of other example of electrode pieces.

FIG. 12 shows a perspective view of an electrostatic deflecting apparatus, FIG. 13 shows a cross-sectional view taken along a line I—I of FIG. 12, and FIG. 14 shows a cross-sectional view taken along a line II—II of FIG. 12. As shown in the figures, the electrostatic deflecting apparatus 20 has an insulating cylindrical supporter 1 supporting 8 electrodes 4a to 4h.

The cylindrical supporter 1 and electrodes 4a to 4h form T grooves, as particularly shown in FIG. 13, and these T grooves are formed by groove portions 31a to 38a in the area in which the charged particle beam is accepted, and by other groove portions 31b to 38b in an area in which the charged particle beam is not directly accepted. The T grooves can be formed by, for example, a wire cutter, and can be also formed by casting the insulator in a mold in which the electrodes and supporters have been are formed and molded.

The shapes of the groove 31 to 38 are not limited to the T type shown in the example, and can be selected from various types having an area in which a charged particle beam is accepted as shown in FIGS. 15A to 15G.

Namely, the grooves 41 to 47 are respectively formed by groove portions 41A to 47a in an area in which a charged particle beam is accepted or irradiated, and by other groove portions 41b to 47b in an area in which the charged particle beam is not accepted.

The number of grooves 31 to 38 corresponds to that of the electrodes, and thus are not limited to the 8 grooves shown in FIGS. 12 and 14.

Figures 16C, 16D:
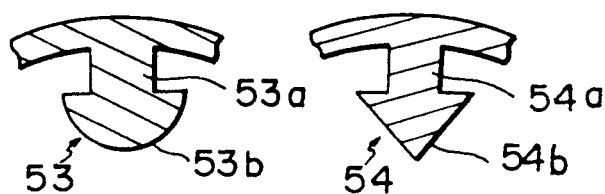

FIGS. 16 shows cross-sectional views of other examples of electrodes according to the present invention.

The electrodes 51 to 54 are composed, respectively, of base portions 51a to 54a and top portions 51b to 54b. The top portion 51b of the electrode 51 shown in FIG. 16A has a flat inner surface, the top portion 52b of the electrode 52 shown in FIG. 16B has accurate concave inner surface, the top portion 53b of the electrode 53 shown in FIG. 16C has a half round convex inner surface, and the top portion 54b of the electrode 54 shown in FIG. 16D has a triangular inner surface.

The inner surface A of the cylinder cylindrical supporter 1 is coated with a metal film formed by, for example, metal plating, except for respective portion of the groove portions 31b to 38b of the grooves 31 to 38. Each electrode is electrically isolated by portions not coated with the metal film, i.e., belt-shaped insulating portions 31C to 38C. The belt-shaped insulating portions are formed, after coating entire inner surface of the cylindrical supporter with a metal film, by removing a part of the metal film with a wire cutter or by electrical discharge machining. The belt-shaped insulating portions 31C and 38C may be formed at any position of the groove portions 31b to 38b of the grooves 31 to 38, as long as the position can not be seen from a charged particle beam extending in a direction of radiation. For example, a position P or Q shown in FIG. 13 may be freely selected.

Accordingly, facing inner surfaces of electrode pieces (plate) 31 to 38 form a pair of electrodes 4a to 4h. Further, the electrodes 4a to 4h are formed as one body with the cylindrical supporter 1, which structure has a large physical strength and a very small size.

Further, by forming belt-shaped insulating portion 31C to 38C at positions which can not be seen from a charged particle beam, each of the electrode pieces 4a to 4h is electrically isolated. On the other hand, by coating positions which can be seen from the charged particle beam with a conductive metal film while conventional exposed insulating portions are removed, the effects of a charge up can be eliminated.

As shown in FIG. 12 by protruding the edge of the electrode pieces 4a to 4h outside that of the cylindrical supporter 1, and by extending the belt-shaped insulating portions 31C to 38C in a radial direction on a edge surface of the cylindrical supporter 1, so that the insulating portions 31C to 38C can not be seen from the charged particle beam, a contact 50 is provided for applying a desired voltage. Note, only one contact 50 of an electrode piece 4h is shown in FIG. 12. As another example of an edge portion of a belt-shaped insulating portion, a shape 52 thereof may be used. Further, since in this example grooves 31 to 38 are electrically connected to each other by a metal film, an earth position, for example, R in FIG. 13, is preferably provided.

We claim:

1. An electrostatic deflecting apparatus for deflecting a charged particle beam comprising:

electromagnetic converging lenses; and first and second electrostatic deflectors respectively including a plurality of electrode plates concentrically and cylindrically disposed, a direction of a first electrical field generated by said first electrostatic deflector being deviated by 90° with reference to a direction of a second electrical field generated by said second electrostatic deflector, said second electrostatic deflector provided in a magnetic field which is formed by said electromagnetic lenses and said first electrostatic deflector and said second electrostatic deflector respectively being fixed together to a same insulating cylindrical element.

2. An electrostatic deflecting apparatus, according to claim 1, wherein an insulating portion, arranged between said electrode plates to electrically isolate said electrode plates forming said first electrostatic deflector and said second electrostatic deflector, is arranged in an area to which charged particle beam is not directly irradiated.

3. An electrostatic deflecting apparatus according to claim 1, wherein said electrode plates is formed of four, eight or twelve plates.

4. An electrostatic deflecting apparatus according to claim 1 or 2, wherein said insulating portion, disposed between said first electrostatic deflector and said second deflector, is disposed at a position to which a charged particle beam is not directly irradiated.

5. An electrostatic deflecting apparatus according to claim 1, wherein said insulating cylindrical element has a same number of grooves as electrode plates along a direction in which a charged particle beam is passed, in an inner surface of the insulating cylindrical element, said grooves having portions which the charged particle beam is directed and not directed, said inner surface to which the charged particle beam is irradiated being covered by a metal film and said inner surface to which the charged particle beam is not irradiated having an electrical insulating effect between electrode plates.

* * * * *